(12) United States Patent
Shigematsu

(10) Patent No.: US 10,943,801 B2
(45) Date of Patent: Mar. 9, 2021

(54) LASER PROCESSING METHOD

(71) Applicant: DISCO CORPORATION, Tokyo (JP)

(72) Inventor: Koichi Shigematsu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/974,147

(22) Filed: May 8, 2018

(65) Prior Publication Data

US 2018/0330972 A1    Nov. 15, 2018

(30) Foreign Application Priority Data

May 9, 2017    (JP) .............................. JP2017-093017

(51) Int. Cl.
| | |
|---|---|
| *H01L 21/67* | (2006.01) |
| *B23K 26/38* | (2014.01) |
| *B23K 26/402* | (2014.01) |
| *H01L 21/683* | (2006.01) |
| *B23K 26/03* | (2006.01) |

(Continued)

(52) U.S. Cl.
CPC ...... *H01L 21/67132* (2013.01); *B23K 26/032* (2013.01); *B23K 26/0622* (2015.10); *B23K 26/0853* (2013.01); *B23K 26/364* (2015.10); *B23K 26/38* (2013.01); *B23K 26/402* (2013.01); *H01L 21/67092* (2013.01); *H01L 21/67115* (2013.01); *H01L 21/67259* (2013.01); *H01L 21/6836* (2013.01); *B23K 2101/40* (2018.08); *B23K 2103/172* (2018.08); *B23K 2103/56* (2018.08); *H01L 2221/68327* (2013.01); *H01L 2221/68381* (2013.01)

(58) Field of Classification Search
CPC ......... H01L 21/67132; H01L 21/67259; H01L 21/6836; H01L 21/67115; H01L 21/78; H01L 22/20; B23K 26/032; B23K 26/38; B23K 26/402; B23K 26/0853; B23K 26/0622; B23K 26/53; B23K 26/0006; B23K 26/0665; B23K 26/364
USPC ....... 438/463, 200, 7; 257/E21.599, E21.238
See application file for complete search history.

(56) References Cited

U.S. PATENT DOCUMENTS

| | | | | |
|---|---|---|---|---|
| 2002/0025616 A1* | 2/2002 | Kamigaki | .............. | B28D 5/023 438/200 |
| 2004/0180473 A1* | 9/2004 | Kawai | .................. | B28D 5/0011 438/114 |

(Continued)

FOREIGN PATENT DOCUMENTS

| | | | |
|---|---|---|---|
| JP | 2012174732 A | * | 9/2012 |
| JP | 2012174732 A | | 9/2012 |

*Primary Examiner* — Mouloucoulaye Inoussa
(74) *Attorney, Agent, or Firm* — Greer Burns & Crain Ltd.

(57) ABSTRACT

A laser processing method includes a step of holding a film side of a workpiece which has been divided into chips and whose reverse side carries an adhesive film stuck thereto, a step of detecting widths of grooves in the workpiece at predetermined chip intervals and central coordinates of the widths of the grooves, a step of calculating laser beam irradiation lines based on the detected widths of the grooves and the detected central coordinates, a step of determining misalignment levels of the calculated laser beam irradiation lines according to misalignments of the grooves in widthwise directions thereof, and a step of processing the adhesive film with a laser beam by applying the laser beam to the adhesive film at bottoms of the grooves along the laser beam irradiation lines, thereby separating the adhesive film.

8 Claims, 10 Drawing Sheets

(51) Int. Cl.
*B23K 26/0622* (2014.01)
*B23K 26/08* (2014.01)
*B23K 26/364* (2014.01)
*B23K 103/16* (2006.01)
*B23K 101/40* (2006.01)
*B23K 103/00* (2006.01)

(56) References Cited

U.S. PATENT DOCUMENTS

| | | | |
|---|---|---|---|
| 2005/0106782 A1* | 5/2005 | Genda | B23K 26/18 |
| | | | 438/118 |
| 2006/0197260 A1* | 9/2006 | Yoshikawa | B23K 26/10 |
| | | | 264/482 |
| 2006/0223285 A1* | 10/2006 | Shigematsu | H01L 21/6835 |
| | | | 438/463 |
| 2008/0029715 A1* | 2/2008 | Morikazu | B23K 26/04 |
| | | | 250/491.1 |
| 2013/0217153 A1* | 8/2013 | Knippels | B23K 26/40 |
| | | | 438/7 |
| 2016/0136843 A1* | 5/2016 | Katoh | B28D 1/044 |
| | | | 125/14 |
| 2016/0151857 A1* | 6/2016 | Odagiri | H01L 21/78 |
| | | | 219/121.61 |
| 2016/0260630 A1* | 9/2016 | Morikazu | H01L 21/6836 |
| 2016/0332260 A1* | 11/2016 | Odanaka | B23K 26/0665 |
| 2017/0348796 A1* | 12/2017 | Nishino | B23K 26/0853 |

* cited by examiner

K: LASER BEAM IRRADIATION LINE

| MISALIGNMENT LEVEL | PROCESSING CONDITIONS | | LENGTH OF PROCESSING MARK (mm) |
|---|---|---|---|
| | PROCESSING FEED RATE (mm/s) | LASER BEAM OUTPUT POWER (W) | |
| 1 (MINUTE) | 200 | 2 | 0 |
| 2 (SMALL) | 100 | 1 | 10 |
| 3 (MEDIUM) | 50 | 0.5 | 20 |
| 4 (LARGE) | 20 | 0.05 | 30 |

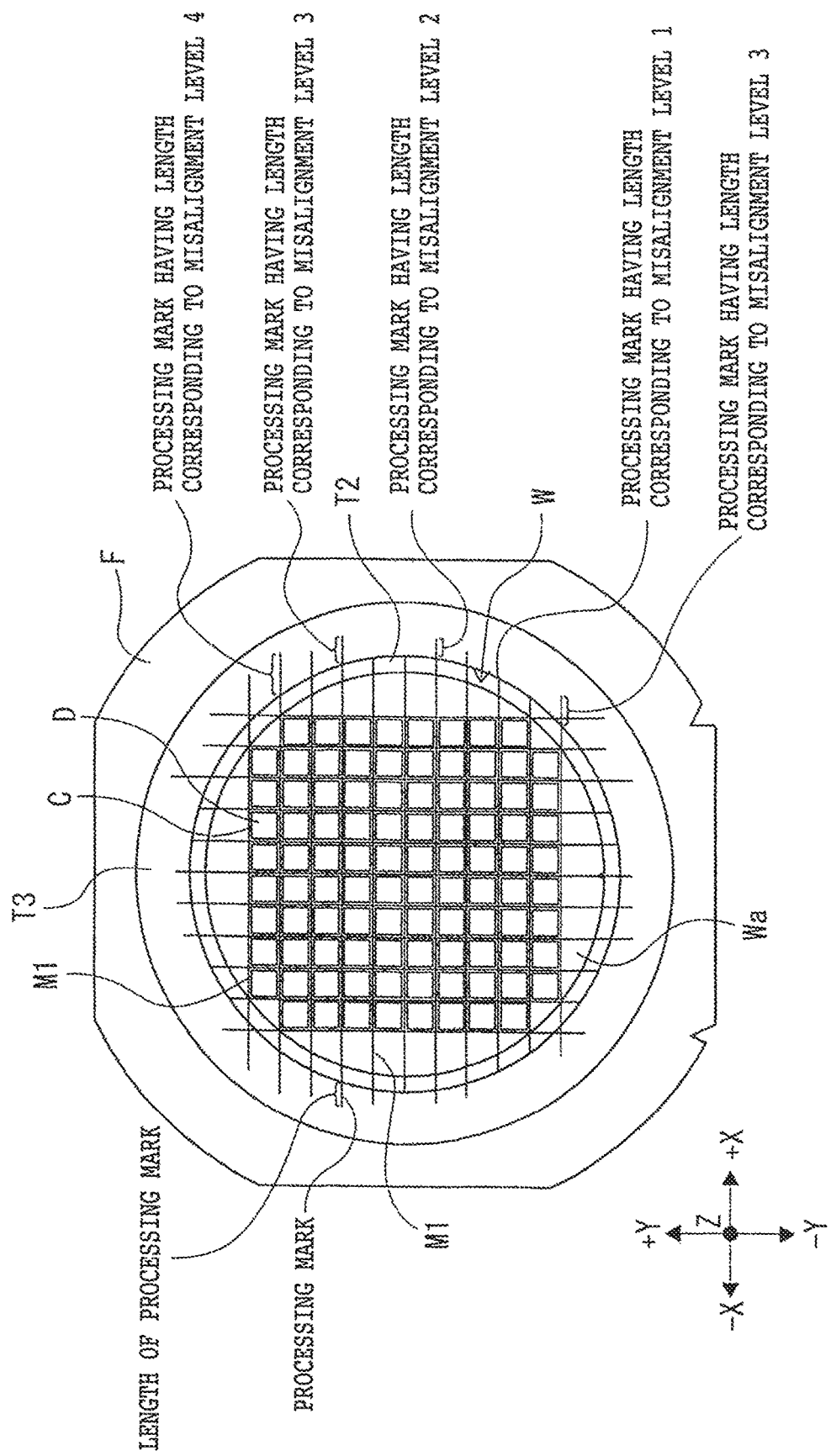

LASER PROCESSING METHOD

BACKGROUND OF THE INVENTION

Field of the Invention

The present invention relates to a laser processing method for applying a laser beam to an adhesive film applied to the reverse side of a workpiece, which has been divided into individual chips along a plurality of intersecting streets on the face side of the workpiece, thereby separating the adhesive film into respective adhesive film pieces stuck to the individual chips.

Description of the Related Art

There is known a method of manufacturing chips with respective adhesive film pieces stuck thereto. According to the known method, an adhesive film for die bonding is stuck to the reverse side of a workpiece such as a semiconductor wafer or the like that has been divided into chips, and a laser beam is applied to portions of the adhesive film that are exposed in gaps between the chips through the gaps from the face side of the workplace, thereby separating the adhesive film into adhesive film pieces that are stuck to the respective chips (see, for example, Japanese Patent Laid-open No. 2012-174732).

According to the method of manufacturing chips disclosed in Japanese Patent Laid-open No. 2012-174732f when the adhesive film is stack to the chips divided from the workplace, there can occur a phenomenon (die shift) in which the chips are slightly shifted in position. If a die shift occurs, the laser beam applied to the adhesive film may be applied to chips, possibly damaging devices thereon.

SUMMARY OF THE INVENTION

Heretofore, according to a known processing method, in order not to damage devices on chips even in the presence of a die shift when an adhesive film is separated by a laser beam, it has been customary to establish laser beam irradiation lines depending on positional misalignments (shifts) of chips, move a workplace held on a holding table and a condenser for applying a laser beam relatively to each other in a processing-feed direction, i.e., an X-axis direction, and move the holding table holding the workpiece thereon, for example, slightly in an indexing-feed direction, i.e., a Y-axis direction, to match the laser beam irradiation lines, while the workpiece is being processed by the laser beam.

However, even though laser beam irradiation lines are properly established, if the workplace is processed under the same conditions for those laser beam irradiation lines where positional misalignments of chips are large and those laser beam irradiation lines where positional misalignments of chips are small, then the laser beam applied to the workpiece may not be able to follow a laser beam irradiation line by moving the holding table in the Y-axis direction. As a result, the laser beam may be applied to a chip, damaging the chip, or if the workpiece is processing-fed at an excessively low rate to avoid such possible chip damage, then the productivity is reduced.

It is therefore an object of the present invention to provide a laser processing method for separating an adhesive film applied to the reverse side of a workpiece that has been divided into individual chips, efficiently into adhesive film pieces with the chips are stuck to their reverse sides, without causing damage to the chips.

In accordance with an aspect of the present invention, there is provided a laser processing method for applying a laser beam to an adhesive film applied to the reverse side of a workpiece, which has been divided into individual chips along a plurality of intersecting streets on the face side of the workpiece, with grooves formed in the workpiece along the streets and the adhesive film disposed at the bottoms of the grooves. The laser processing method includes: a holding step of holding an adhesive film side of the workpiece on a holding table; a groove width detecting step of detecting widths of the grooves in the workpiece held in the holding step at predetermined chip intervals and detecting central coordinates of the widths of the grooves; a laser beam irradiation line calculating step of calculating laser beam irradiation lines along which the laser beam is to be applied to the adhesive film, based on the widths of the grooves and the central coordinates thereof detected in the groove width detecting step; a level determining step of determining misalignment levels of the laser beam irradiation lines calculated in the laser beam irradiation line calculating step according to misalignments of the grooves in widthwise directions thereof; and a laser processing step of processing the adhesive film with the laser beam by applying the laser beam to the adhesive film at the bottoms of the grooves along the laser beam irradiation lines calculated in the laser beam irradiation line calculating step, thereby separating the adhesive film. The laser processing step includes a step of processing the adhesive film with the laser beam under processing conditions corresponding to the misalignment levels determined in the level determining step.

Preferably, the laser processing step includes a step of processing the adhesive film with the laser beam at processing feed rates corresponding to the misalignment levels determined in the level determining step.

Preferably, a tape is stuck, to a lower surface of the adhesive film on the reverse side of the workpiece, and the laser processing step includes a step of applying the laser beam to the tape along the grooves beyond an outer peripheral edge of the workpiece, thereby forming processing marks on the tape, the processing marks having lengths corresponding to the misalignment levels.

With the laser processing method according to the present invention, in the laser processing step, the adhesive film is processed with a laser beam under processing conditions corresponding to misalignment levels determined in the level determining step. Therefore, a misalignment level is determined with respect to each single laser beam irradiation line, and the adhesive film is processed with the laser beam along the single laser beam irradiation line under processing conditions corresponding to the determined misalignment level. Consequently, the adhesive film can be separated efficiently without causing damage to the chips.

In the laser processing step, the adhesive film is processed with the laser beam at a processing feed rate corresponding to the misalignment level determined in the level determining step. The laser beam thus has a higher ability to follow the laser beam irradiation line by moving the workpiece in indexing-feed directions (Y-axis directions), thereby making it possible to separate the adhesive film efficiently without causing damage to the chips.

The tape is stuck to the lower surface of the adhesive film on the reverse side of the workpiece. In the laser processing step, the laser beam is applied to the tape along the grooves beyond an outer peripheral edge of the workpiece, thereby forming processing marks on the tape, the processing marks having lengths corresponding to the misalignment levels. The processing marks make it easy for the operator to recognize the misalignment levels of the laser beam, irradiation lines based on the lengths of the processing marks on the tape that can easily be visually recognized by the operator.

After the adhesive film has been processed with the laser beam, the operator confirms with a microscope or the like whether the chips have been damaged by the laser beam or not. If the operator confirms all the laser beam irradiation lines one by one, then the working efficiency tends to be lowered. Those laser beam irradiation lines with small misalignment levels may indicate a very small possibility that the corresponding chips have been processed with the laser beam. However, those laser beam irradiation lines with large misalignment levels may indicate a greater possibility that the corresponding chips have been processed with the laser beam. Since the operator finds it easy to recognize the misalignment levels of the laser beam irradiation lines based on the lengths of the processing marks after the laser processing step, the operator may inspect the laser beam irradiation lines differently for higher efficiency, e.g., by inspecting each of those laser beam irradiation lines with large misalignment levels over its entire length and inspecting each of those laser beam irradiation lines with small misalignment levels at several locations along its length. The working efficiency can be increased by selectively carrying out appropriate inspections on the laser beam irradiation lines depending on the misalignment levels thereof.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 15 is a plan view depicting the workpiece after the adhesive film is separated in a grid pattern and the tape with, processing marks thereon.

DETAILED DESCRIPTION OF THE PREFERRED EMBODIMENT

Figure 1:
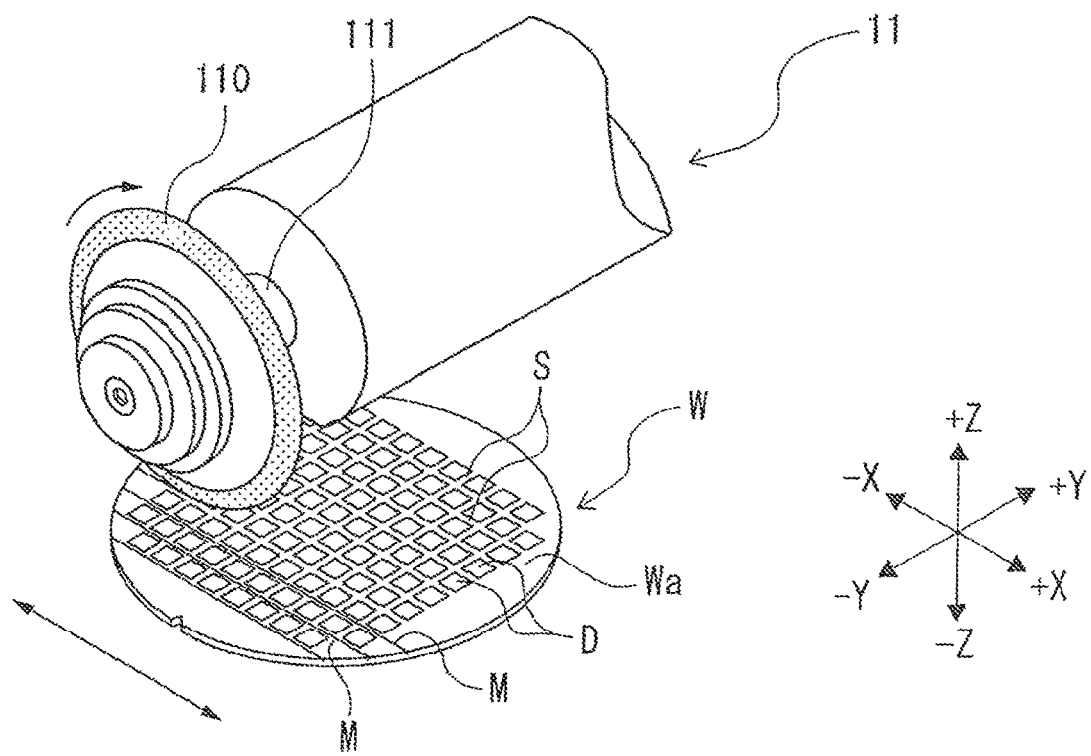
FIG. 1 is a perspective view depicting the manner in which half-cut grooves are formed to a finished thickness in a workpiece by cutting means.

As depicted in FIG. 1, a workpiece W to be divided into chips is a circular semiconductor wafer including a silicon substrate, for example, and has on a face side Wa thereof a plurality of devices D formed in respective regions demarcated in a grid pattern by a plurality of perpendicular streets S. Steps for dividing the workpiece W into chips that support the devices D thereon will be described below.

First, cutting means 11 depicted in FIG. 1 forms half-cut grooves to a finished thickness in the workplace W from its face side Wa along the streets S. The cutting means 11 includes a spindle 111 whose axial directions are directions (Y-axis directions) that are horizontally perpendicular to directions (X-axis directions) along which the workpiece W is movable. The cutting means 11 also includes an annular cutting blade 110 fixed to a tip end of the spindle 111.

The workpiece W is held under suction on a chuck table, not depicted, while having its face side Wa directed upwardly. The chuck table that holds the workpiece W under suction thereon is rotatable about a vertical axis (Z-axis directions) and reciprocally movable in the X-axis directions. The chuck table with the workpiece W held thereon is fed in a −X direction, whereupon the Y-axis coordinate position of a street S on the workpiece W along which the cutting blade 110 is to cut into the workpiece W is detected. When, the Y-axis coordinate position of the street S is detected, the cutting means 11 is indexing-fed in one of the Y-axis directions, bringing the street S to be cut and the cutting blade 110 into positional alignment with each other in the Y-axis directions.

The spindle 111 is then rotated about its own axis, rotating the cutting blade 110 clockwise as viewed in a +Y direction. The cutting means 11 is incising-fed in a −Z direction, partly cutting the workpiece W, and positioned to keep the lowermost end of the cutting blade 110 at a predetermined height short of fully cutting off the workpiece W. The predetermined height is such a height where the distance from the face side Wa of the workpiece W to the bottom of a half-cut groove to be formed therein represents a finished thickness of the workpiece W.

The chuck table with the workpiece W held thereon is further fed in the −X direction at a predetermined cutting rate, causing the cutting blade 110 to incise the workpiece W from its face side Wa along the street S thereby to form a half-cut groove M to the finished thickness in the workpiece W along the street S. When the workpiece W is continuously fed along the X-axis directions to a position where the cutting blade 110 has finished cutting the street S, the cutting blade 110 is lifted off the workpiece W, and the workpiece W is moved back in a +X direction to its origin. Then, the cutting blade 110 is indexing-fed in the +Y direction by a distance commensurate with an interval between adjacent streets S, bringing a next street S to be cut and the cutting blade 110 into positional alignment with each other in the Y-axis directions. Thereafter, a half-cut groove M is cut in the workpiece W along the next street S in the same manner as described above. The above process is repeated to form half-cut grooves M in the workpiece W along all the streets S that extend in the X-axis directions. Then, the workpiece W is turned 90 degrees, and cut by the cutting blade 110 to form half-cut grooves M therein along all the streets S that extend in the Y-axis directions. In this manner, the half-cut grooves M are formed in the workpiece W along all the streets S thereon.

Figure 2:
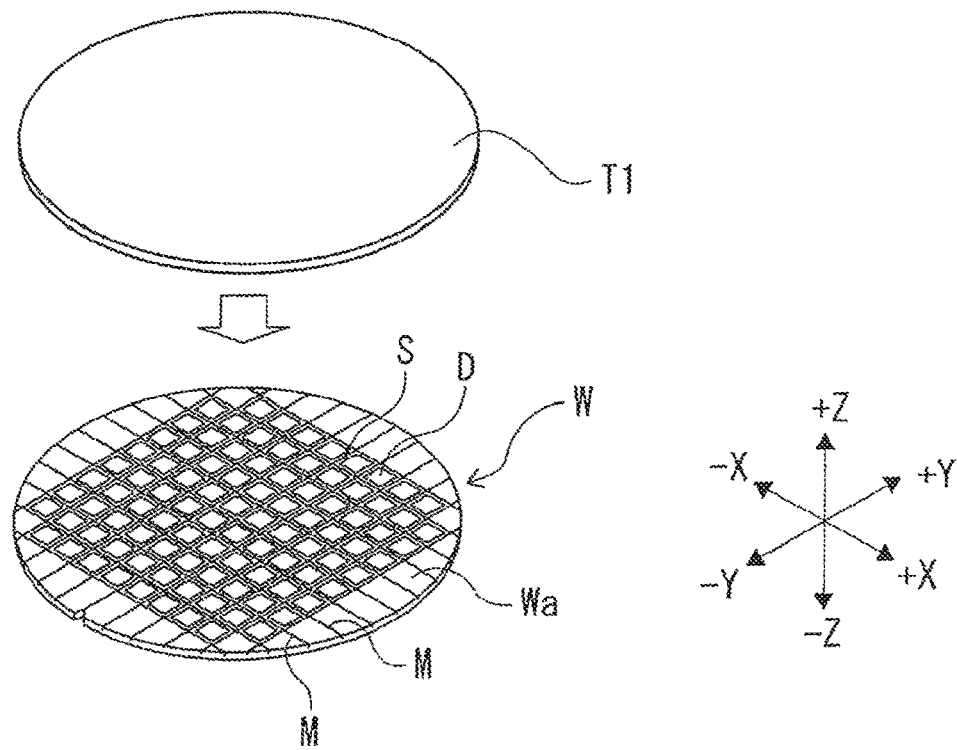
FIG. 2 is a perspective view depicting the manner in which a protective member is placed onto a face side of the workpiece.

As depicted in FIG. 2, a protective member T1 is placed on the face side Wa of the workpiece W in which the half-cut grooves M have been formed. The protective member T1 is a circular sheet having a diameter which is essentially the same as the workpiece W. For example, the protective member T1 is pressed against and stuck, to the face side Wa of the workpiece W by a press roller or the like on a sticking table, not depicted.

Figure 3:
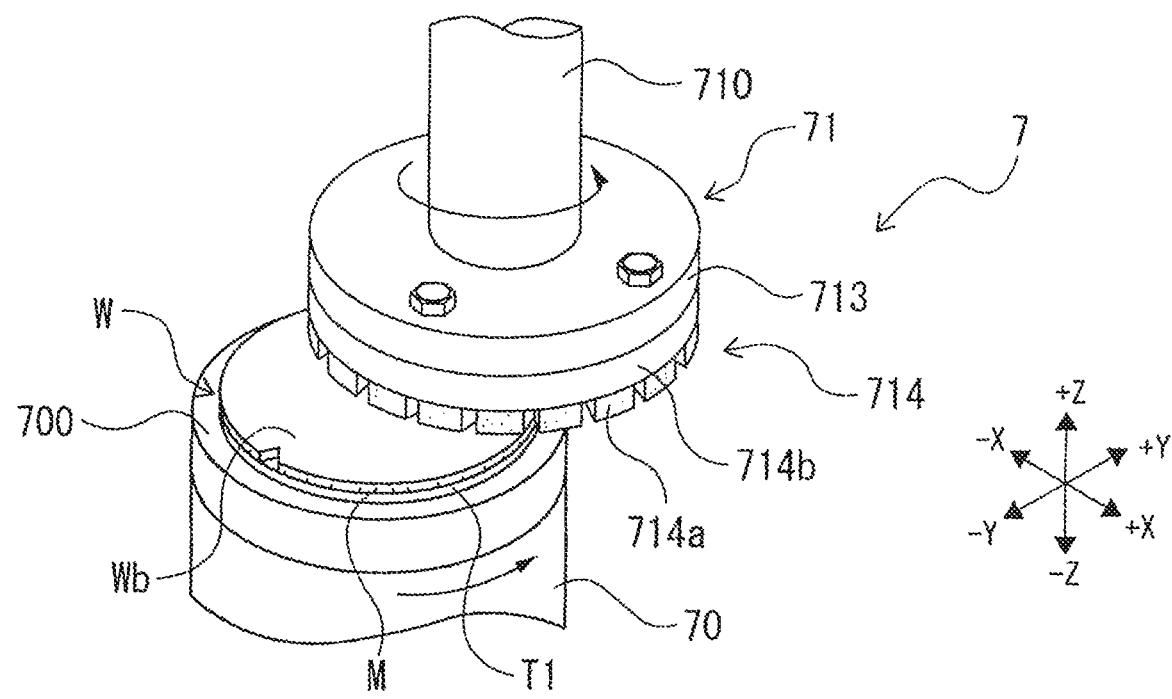
FIG. 3 is a perspective view depicting the manner in which a reverse side of the workpiece is ground to thin the workpiece to the finished thickness and the workpiece is divided into a plurality of chips.

The workpiece W with the protective member T1 stuck thereto is transported to a grinding apparatus 7 depicted in FIG. 3. The grinding apparatus 7 includes a holding table 70 having a circular outer profile and a holding surface 700 made of a porous material or the like for holding the workpiece W under suction thereon. The holding table 70 is rotatable about an axis along the Z-axis directions and movable in the Y-axis directions. As depicted in FIG. 3, the workpiece W with the protective member T1 facing downwardly is placed on the holding surface 700. A suction force produced by a suction source, not depicted, is transmitted to and acts on the holding surface 700, so that the holding table 70 holds the workpiece W under suction on the holding surface 700.

The workpiece W held on the holding table 70 has a reverse side Wb, which faces upwardly, to be ground by grinding means 71. The grinding means 71 includes, for example, a rotational shaft 710 rotatable about an axis along the Z-axis directions, a disk-shaped mount 713 connected to the lower end of the rotational shaft 710, and a grinding wheel 714 detachably connected to a lower surface of the mount 713. The grinding wheel 714 includes a wheel base 714b joined to the mount 713 and a plurality of grinding stones 714a substantially shaped as a rectangular parallelepiped each and disposed in an annular pattern on a bottom surface of the wheel base 714b. The grinding stones 714a are made up of abrasive grains of diamond secured together by a resin bond, a metal bond, or the like.

First, the holding table 70 is moved, in the +Y direction and positioned with respect to the grinding means 71 such that the center of rotation of the grinding wheel 714 is spaced a predetermined distance from the center of rotation of the workpiece M in the +Y direction and the grinding stones 714a will rotate along a path extending through the center of rotation of the workpiece W. Then, the rotational shaft 710 rotates about its own axis, rotating the grinding wheel 714 counterclockwise as viewed in the −Z direction in FIG. 3. The grinding means 71 is fed in the −Z direction to bring the grinding stones 714a into abutment against the reverse side Wb of the workpiece W, thereby grinding the reverse side Wb of the workpiece W. While the reverse side Wb of the workpiece W is being ground, the holding table 70 is rotated counterclockwise as viewed in the −Z direction, rotating the workpiece W thereon in unison therewith. Therefore, the grinding stones 714a grind the reverse side Wb of the workpiece W in its entirety. At the same time, grinding water is supplied to the region where the grinding stones 714a and the reverse side Wb of the workpiece W contact each other, cooling the region and cleaning away debris produced from the grinding stones 714a and the reverse side Wb of the workpiece W.

The grinding means 71 is grinding-fed downwardly at a predetermined grinding rate to grind the reverse side Wb of the workpiece W until the bottoms of the half-cut grooves M are exposed on the reverse side Wb of the workpiece W. When the bottoms, of the half-cut grooves M are exposed on the reverse side Wb of the workpiece W, the workpiece W has been thinned down to the finished thickness, and divided into a plurality of chips C that support the respective devices D thereon, as depicted in FIG. 4.

Figure 4:
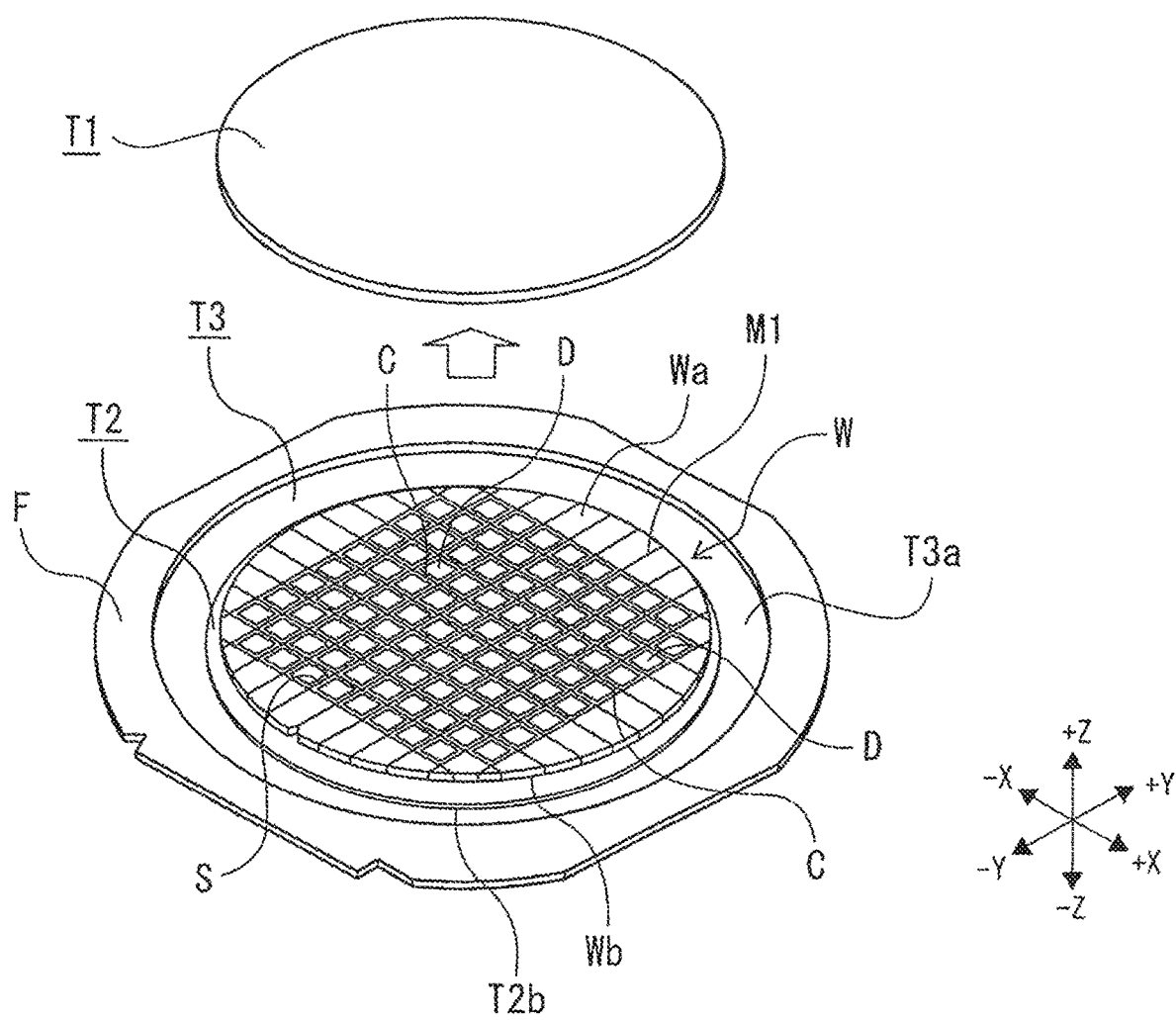
FIG. 4 is a perspective view depicting the manner in which the protective member is removed from, the face side of the workpiece that is supported on an annular frame by a tape with an adhesive film stuck to the reverse side of the workpiece.

As depicted in FIG. 4, an adhesive film T2 for die bonding, such as a DAF (Die Attach Film) or the like, is stuck to the reverse side Wb of the workpiece W that has been divided into the chips C. The adhesive film T2, which is of a circular shape, has an outside diameter larger than the outside diameter of the workpiece W, for example. The workpiece W with the adhesive film T2 stuck to the reverse side Wb thereof now has grooves M1 aligned with the respective streets S. The adhesive film T2 provides the bottoms of the grooves M1, i.e., the gaps between the chips C. A tape T3 is stuck to a lower surface (base surface) T2b of the adhesive film T2. The tape T3 is a circular sheet having an outside diameter larger than the outside diameter of the adhesive film T2. The tape T3 has an adhesive surface T3a whose outer circumferential portion is stuck to an annular frame F that has a circular opening defined therein. Consequently, the workpiece W is supported on the annular frame F by the tape T3 and can be handled through the annular frame F. The adhesive film T2 may be stuck to the workpiece W either by a tape mounter, not depicted, a sticking roller being rolled on the adhesive film T2 to press the adhesive film T2 against the workpiece W or manually by the operator. Then, the protective member T1 is peeled off the face side Wa of the workpiece W.

Figure 5:
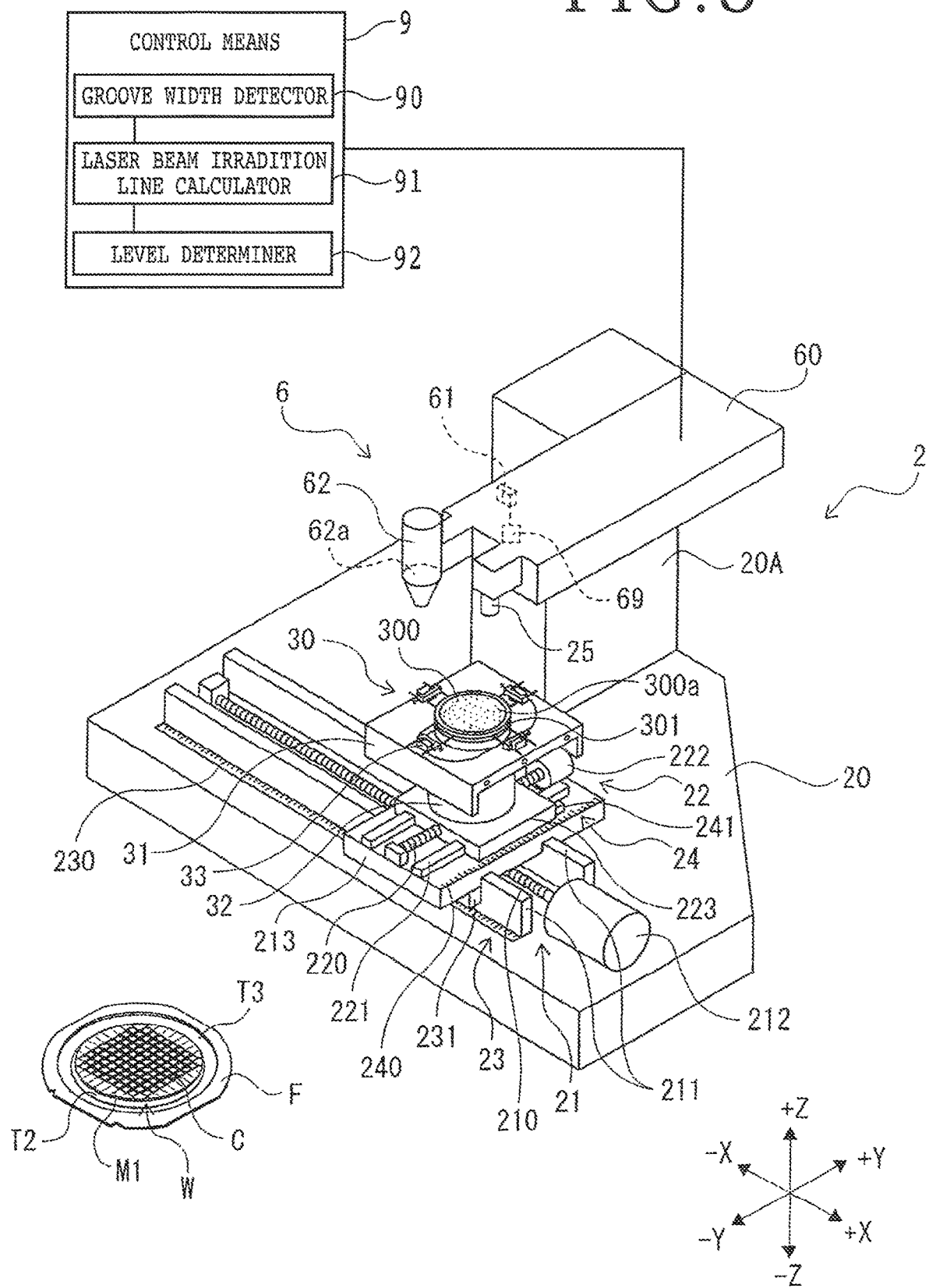
FIG. 5 is a perspective view depicting by way of example a laser processing apparatus which carries out a laser processing method according to an embodiment of the present invention.

The workpiece W supported on the annular frame F is then transported to a laser processing apparatus 2 depicted in FIG. 5, which carries out a laser processing method according to an embodiment of the present invention. As depicted in FIG. 5, the laser processing apparatus 2 includes a holding table 30 for holding the workpiece W under suction thereon, laser beam applying means 6 for applying a laser beam having a predetermined wavelength to the adhesive film T2 on the workpiece W that is held on the holding table 30, and control means 9 for controlling operation of the laser processing apparatus 2.

The laser processing apparatus 2 includes a base 20 supporting on a front portion thereof, i.e., on a −Y direction side thereof, processing-feed means 21 for reciprocally moving the holding table 30 in the X-axis directions as processing-feed directions. The processing-feed means 21 includes a ball screw 210 having an axis along the X-axis directions, a pair of guide rails 211 parallel to the ball screw 210, an electric motor 212 such as a stepping motor for rotating the ball screw 210 about its own axis, and a movable plate 213 having an internal nut threaded over the ball screw 210 and a bottom surface held in sliding contact with the guide rails 211. When the stepping motor 212 rotates the ball screw 210 about its own axis, the movable plate 213 is moved in one of the X-axis directions while being guided by the guide rails 211, moving the holding table 30 disposed on the movable plate 213 in the X-axis direction in unison with the movable plate 213.

The laser processing apparatus 2 also includes X-axis-direction position measuring means 23 for measuring a position of the holding table 30 along the X-axis directions. The X-axis-direction position measuring means 23 includes a scale 230 extending in the X-axis directions along the guide rails 211, and a reader 231 fixed to the movable plate 213 and movable with the movable plate 213 along the scale 230, for reading the graduations of the scale 230. The reader 231, which is an optical reader, for example, for reading light reflected from the graduations of the scale 230, detects the graduations of the scale 230 and outputs a pulse signal representing a detected graduation to the control means 9.

The control means 9 counts pulse signals from the X-axis-direction position measuring means 23 to detect a position of the holding table 30 along the X-axis directions.

According to the present embodiment, the electric motor 212 of the processing-feed means 21 is a stepping motor that is energized by drive pulses supplied from a pulse generator, not depicted, of the control means 9. Therefore, the control means 9 may detect a position of the holding table 30 along the X-axis directions by counting drive pulses supplied from the pulse generator thereof to the stepping motor 212 of the processing-feed means 21.

The electric motor 212 of the processing-feed means 21 may be a servomotor rather than a stepping motor, with a rotary encoder connected to the servomotor. According to the alternative, the rotary encoder is connected to the control means 9, which has a function as a servo amplifier. After the servomotor is supplied with an operation signal from the control means 9, the rotary encoder outputs an encoder signal representing the rotational speed of the servomotor to the control means 9. Based on the encoder signal from the rotary encoder, the control means 9 calculates a distance that the holding table 30 has moved, in one of the X-axis directions, and detects a corresponding position of the holding table 30 along the X-axis directions.

The holding table 30 that holds the workpiece W thereon has a circular output profile and includes an attracting member 300 made of a porous material or the like for attracting the workpiece W thereon and a frame 301 supporting the attracting member 300. The attracting member 300 is held in fluid communication with a suction source, not depicted, and holds the workpiece W under suction on a holding surface 300a that is provided as an exposed surface of the attracting member 300. The holding table 30 is surrounded by a cover 31 that extends horizontally therearound, and is rotatable about a vertical axis along the Z-axis directions by rotating means 32 disposed on a bottom side of the holding table 30. Four securing clamps 33 are disposed at equal circumferentially spaced intervals on the cover 31 around the holding table 30, for securing the annular frame F that supports the workpiece W thereon to the holding table 30.

The holding table 30, which is reciprocally movable in the X-axis directions by the processing-feed means 21, as described above, is also movable in the Y-axis directions by Y-axis-direction moving means 22 disposed below the holding table 30 with the rotating means 32 interposed therebetween. The Y-axis-direction moving means 22 includes a ball screw 220 having an axis along the Y-axis directions, a pair of guide rails 221 parallel to the ball screw 220, an electric motor 222 such as a stepping motor for rotating the ball screw 220 about its own axis, and a movable plate 223 supporting the holding table 30 and having an internal nut threaded over the ball screw 220 and a bottom surface held in sliding contact with the guide rails 221. When the stepping motor 222 rotates the ball screw 220 about its own axis, the movable plate 223 is moved in one of the Y-axis directions while being guided by the guide rails 221, moving the holding table 30 supported on the movable plate 223 in the Y-axis direction in unison with the movable plate 223.

The laser processing apparatus 2 also includes Y-axis-direction position measuring means 24 for measuring a position of the holding table 30 along the Y-axis directions. The Y-axis-direction position measuring means 24 includes a scale 240 extending in the Y-axis directions along the guide rails 221, and a reader 241 fixed to the movable plate 223 and movable with the movable plate 223 along the scale 240, for reading the graduations of the scale 240. The reader 241, which is an optical reader, for example, for reading light reflected from the graduations of the scale 240, detects the graduations of the scale 240 and outputs a pulse signal representing a detected graduation to the control means 9.

The control means 9 counts pulse signals from the Y-axis-direction position measuring means 24 to detect a position of the holding table 30 along the Y-axis directions.

According to the present embodiment, the electric motor 222 of the Y-axis-direction moving means 22 is a stepping motor that is energized by drive pulses supplied from a pulse generator, not depicted, of the control means 9. Therefore, the control means 9 may detect a position of the holding table 30 along the Y-axis directions by counting drive pulses supplied from the pulse generator thereof to the stepping motor 222 of the Y-axis-direction moving means 22.

The electric motor 222 of the Y-axis-direction moving means 22 may be a servomotor rather than a stepping motor, with a rotary encoder connected to the servomotor. According to the alternative, the rotary encoder is connected to the control means 9, which has a function as a servo amplifier. After the servomotor is supplied with an operation signal from the control means 9, the rotary encoder outputs an encoder signal representing the rotational speed of the servomotor to the control means 9. Based on the encoder signal from the rotary encoder, the control means 9 calculates a distance that the holding table 30 has moved in one of the Y-axis directions, and detects a corresponding position of the holding table 30 along the Y-axis directions.

An upstanding column 20A is mounted on a rear portion of the base 20, i.e., on the +Y direction side thereof, and the laser beam applying means 6 is disposed on a side surface of the column 20A which faces in the +X direction. The laser beam applying means 6 includes a housing 60 in the form of a rectangular parallelepiped lying horizontally over the base 20. The housing 60 houses therein a laser beam oscillator 61 such as a YAG (Yttrium Aluminum Garnet) laser beam oscillator, a YVO4 (Yttrium Vanadate) laser beam oscillator, or the like for emitting a laser beam having a predetermined wavelength. The laser beam applying means 6 also includes an output power adjuster 69 for adjusting the output power of the laser beam emitted from the laser beam oscillator 61.

The housing 60 supports on a tip end thereof a condenser 62 having a condensing lens 62a disposed therein. In the laser beam applying means 6, a laser beam emitted from the laser beam oscillator 61 in the −Y direction and having its output power adjusted by the output power adjuster 69 is reflected by mirrors, not depicted, in the housing 60 and the condenser 62 and applied to the condensing lens 62a. The condensing lens 62a focuses the laser beam at a predetermined height on the adhesive film T2 stuck to the workpiece W that is held on the holding table 30. The position of the focused spot of the laser beam that is focused by the condenser 62 can be adjusted in directions perpendicular to the holding surface 300a of the holding table 30, i.e., the Z-axis directions, by focused spot position adjusting means, not depicted. The laser beam may be transmitted from the laser beam oscillator 61 to the condenser 62 by an optical fiber.

The housing 60 also supports on the tip end thereof image capturing means 25 near the condenser 62. The image capturing means 25 includes a light emitter for applying light to the workpiece W and a camera including an optical system for catching light reflected from the workpiece W and an image capturing device (CCD (Charge Coupled Device)) or the like for outputting an electric signal representing the reflected light. The image capturing means 25 captures an image of the workpiece W based on the electric signal from the image capturing device, and sends a captured image signal representing the captured image to the control means 9.

The control means 9, which includes a CPU (Central Processing Unit) and a storage device such as a memory or the like, is electrically connected to the processing-feed means 21, the X-axis-direction position measuring means 23, the Y-axis-direction moving means 22, the Y-axis-direction position measuring means 24, the laser beam applying means 6, and the image capturing means 25, etc. The control means 9 includes an input interface that is supplied with pulse signals from the X-axis-direction position measuring means 23, pulse signals from the Y-axis-direction position measuring means 24, and captured image signals from the image capturing means 25, etc. The control means 9 also has an output interface that outputs control signals to the processing-feed means 21, the Y-axis-direction moving means 22, and the laser beam applying means 6, etc.

Various steps of a laser processing method according to the present invention will hereinafter be described below.

(1) Holding Step

Figure 6:
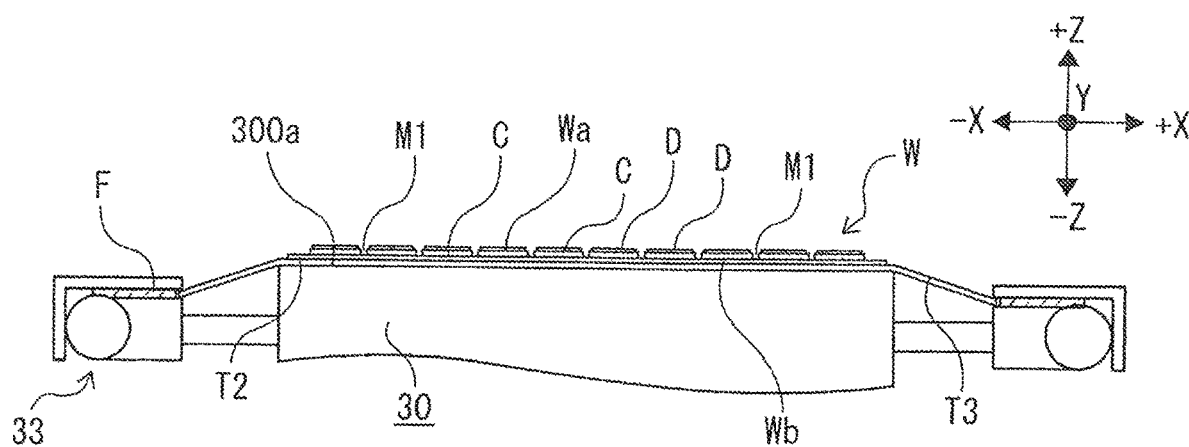
FIG. 6 is a cross-sectional view depicting the manner in which the adhesive film side of the workpiece is held on a holding table.

As depicted in FIG. 6, the workpiece W that is supported on the annular frame F is placed on the holding surface 300a of the holding table 30 with the adhesive film T2 side of the workpiece W being directed downwardly. A suction force produced by the non-illustrated suction source held in fluid communication with the holding surface 300a is transmitted to the holding surface 300a, causing the holding surface 300a to hold under suction the workpiece W with its face side Wa exposed on the holding surface 300a. The annular frame F is secured in place by the clamps 33.

(2) Groove Width Detecting Step

Figure 7:
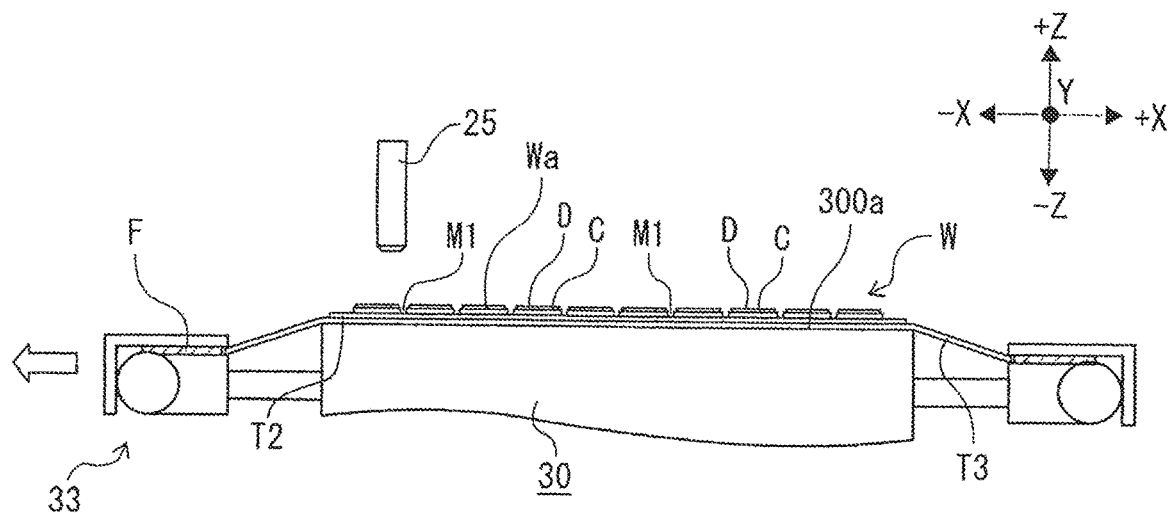
FIG. 7 is a cross-sectional view depicting the manner in which an image of a groove in the workpiece and a peripheral region thereof is captured at a predetermined chip interval by image capturing means in a groove width detecting step.
Figure 8:
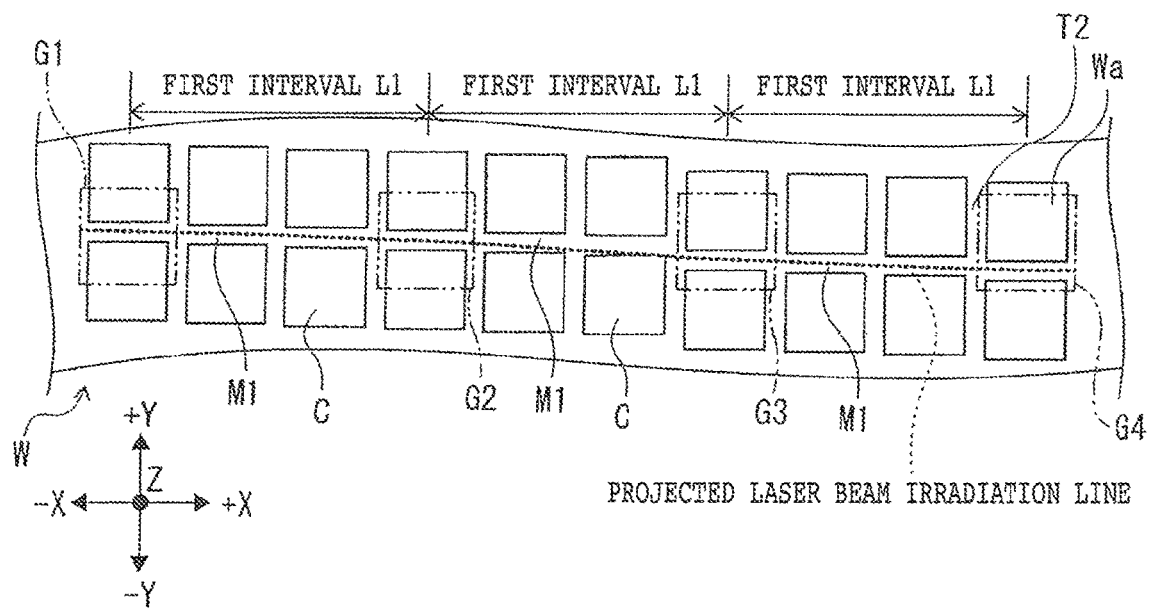
FIG. 8 is a plan view schematically depicting an image capturing area of the face side of the workpiece and a projected laser beam irradiation line in the groove width detecting step.

Then, as depicted in FIG. 7, the workpiece W held on the holding table 30 is fed in the −X direction (forward direction), and the workpiece W and the image capturing means 25 are aligned in position with each other so that the image capturing means 25 can capture an image of a projected laser beam irradiation line generally along a single groove M1 that extends along the X-axis directions on the is workpiece W. Then, while the workpiece W and the image capturing means 25 are being moved relatively to each other in a direction (one of the X-axis directions) along which the projected laser beam irradiation line extends, the image capturing means 25 captures images of the face side Wa at predetermined chip intervals. Specifically, as depicted in FIG. 8, the image capturing means 25 (not depicted in FIG. 8) captures images of the face, side Wa at first intervals L1 along the projected laser beam irradiation line. According to the present embodiment, each of the first intervals L1 represents a distance over every three chips C, or specifically between the centers of first and fourth chips C with two chips C interposed therebetween along the X-axis directions. However, the first intervals L1 are not limited to such a distance. For example, the image capturing means 25 generates captured images of four image capturing areas G1, G2, G3 and G4 indicated by the two-dot-and-dash lines in FIG. 8. The image capturing areas G1, G2, G3 and G4 cover segments of the projected laser beam irradiation line and chips C in their peripheries. The devices D on the respective chips C are omitted from illustration in FIG. 8. In FIG. 8, some chips C are positionally misaligned in the Y-axis directions due to a die shift thereof that occurs when the adhesive film T2 is stuck to the workpiece W divided into the chips C.

Figure 9:
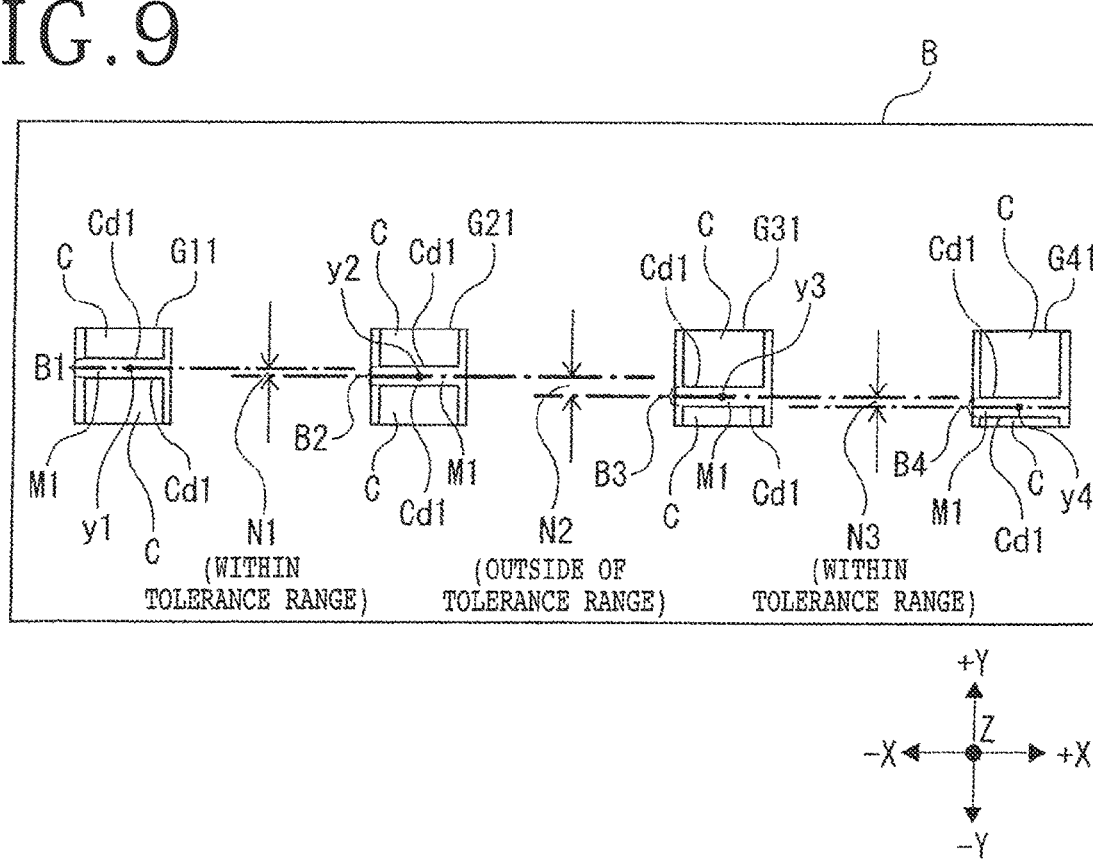
FIG. 9 is a plan view schematically depicting a captured image formed in the groove width detecting step.

As depicted in FIG. 5, the control means 9 includes a groove width detector 90 for detecting the width of the groove M1 in the workpiece W and the central coordinate of the width of the groove M1 from the captured images generated by the image capturing means 25. The image capturing means 25 sends data of the four captured images to the groove width detector 90 of the control means 9. The groove width detector 90 performs a filtering process on the received data of the captured images, using a sharpening filter for emphasizing the outer edges of the chips C in the captured images, for example. FIG. 9 depicts captured images G11, G21, G31 and G41 generated by the groove width detector 90 after it has performed the filtering process, displayed on a hypothetical output screen B (orthogonal coordinate system of X and Y axes) having a predetermined resolution, for example. The captured images G11, G21, G31 and G41 depicted in FIG. 9 correspond respectively to the image capturing areas G1, G2, G3 and G4 depicted in FIG. 8.

The groove width detector 90 then detects respective outer edges Cd1 of two adjacent chips C spaced in the Y-axis directions perpendicular to the X-axis directions, from the captured image G11 depicted in FIG. 9. These outer edges Cd1 are recognized as coordinate values in the Y-axis directions, for example. The groove width detector 90 calculates the sum in the Y-axis directions of pixels between the outer edges Cd1 of the two chips C, and detects the calculated sum of pixels as the width B1 of the groove M1 in the captured image G11.

Since the outer edge Cd1 of each of the chips C represents the boundary between the groove M1 and the chip C in the Y-axis directions, the groove width detector 90 detects the Intermediate position in the Y-axis directions between the outer edges Cd1 of the two chips C as the central coordinate y1 in the Y-axis directions of the width B1 of the groove M1. The central coordinate y1 in the Y-axis directions of the width B1 of the groove M1 is detected at the central position in the X-axis directions in the captured image G11, for example.

Similarly, the groove width detector 90 detects the widths B2, B3 and B4 of the grooves M1 and the central coordinates y2, y3 and y4 of the widths B2, B3 and B4 of the grooves M1 from the captured images G21, G31 and G41 depicted in FIG. 9.

(3) Laser Beam Irradiation Line Calculating Step

As depicted in FIG. 5, the control means 9 includes a laser beam irradiation line calculator 91 for calculating a laser beam irradiation line based on the groove widths B1 through B4 and the central coordinates y1 through y4 of the respective groove widths B1 through B4 detected by the groove width detector 90. The groove-width detector 90 transfers data of the detected groove widths B1 through B4 and the detected central coordinates y1 through y4 of the respective groove widths B1 through B4 to the laser beam irradiation line calculator 91. The laser beam irradiation line calculator 91 compares the central coordinate y1 of the groove width B1 in the captured image G11 and the central coordinate y2 of the groove width B2 in the captured image G21 that is positioned adjacent to the captured image G11 with each other, and calculates a misalignment (shift) N1 of the groove M1 between the captured images G11 and G21. The misalignment N1 is represented by the difference between the coordinate values of the central coordinate y1 of the groove width B1 and the central coordinate y2 of the groove width B2, i.e., the distance between the central coordinates y1 and y2 in the Y-axis directions.

Likewise, the laser beam irradiation line calculator 91 compares the central coordinate y2 of the groove width B2 in the captured image G21 and the central coordinate y3 of the groove width B3 in the captured image G31 that is positioned adjacent to the captured image G21 with each other, and calculates a misalignment (shift) N2 of the groove M1 between the captured images G21 and G31, and compares the central coordinate y3 of the groove width B3 in the captured image G31 and the central coordinate y4 of the groove width B4 in the captured image G41 that is positioned adjacent to the captured image G31 with each other, and calculates a misalignment (shift) N3 of the groove M1 between the captured images G31 and G41.

For example, the laser beam irradiation line-calculator 91 stores in advance a tolerance range for misalignments. The laser beam irradiation line calculator 91 decides whether the calculated misalignments N1 through N3 fall in the tolerance range or not. If the calculated misalignments N1 through N3 fall in the tolerance range, then the laser beam irradiation line calculator 91 determines a line interconnecting the central coordinates y1 through y4 of the groove widths B1 through B4 in the respective captured images G11 through G41 as a laser beam irradiation line.

On the other hand, if any of the calculated misalignments N1 through N3 falls outside of the tolerance range, then the laser beam irradiation line calculator 91 decides on an error and does: not determine a laser beam irradiation line. In the present embodiment, as depicted in FIG. 9, the misalignment N2 is larger than the tolerance range. If the line interconnecting the central coordinates y1 through y4 of the groove widths B1 through B4, i.e., the laser beam irradiation line depicted in FIG. 8, is determined as a laser beam irradiation line, then a chip C between the image capturing area G2 and the image capturing area G3, i.e., a sixth chip C from the left in the +X direction as depicted in FIG. 8, overlaps the determined laser beam irradiation line. Then, when, a laser processing step is carried out on the workpiece W, a laser beam is applied to the overlapping chip C, possibly damaging the device D thereon.

According to the present embodiment, if the laser beam irradiation line calculator 91 has calculated the misalignment N2 in excess of the tolerance range, the laser beam irradiation line calculator 91 changes a condition in the groove width detecting step, i.e., reduces the chip intervals at which to capture images, and then controls the groove width detector 90 to perform the groove width detecting step again (hereinafter referred to as "second groove width detecting step"). After the second groove width detecting step has been performed, the laser beam irradiation line calculator 91 stores the captured images G11 through G14, the groove widths B1 through B4, and the central coordinates y1 through y4 of the groove widths B1 through B4, as data for finally calculating a laser beam irradiation line.

(4) Second Groove Width Detecting Step

In the present embodiment, the misalignment N1 calculated based on the captured image G11 and the captured image G21 depicted in FIG. 9 and the misalignment N3 calculated based on the captured image G31 and the captured image G41 depicted in FIG. 9 do not exceed the allowable range. Therefore, the areas between the image capturing area G1 and the image capturing area G2 depicted. In FIG. 8 and the areas between the image capturing area G3 and the image capturing area G4 depicted in FIG. 8 will not be handled as Image capturing areas in the second groove width detecting step.

On the other hand, inasmuch as the misalignment N2 detected based on the captured image G21 and the captured image G31 depicted in FIG. 9 exceeds the tolerance range, the areas between the image capturing area G2 and the image capturing area G3 depicted in FIG. 8 will be handled as image capturing areas in the second groove width detecting step.

Figure 10:
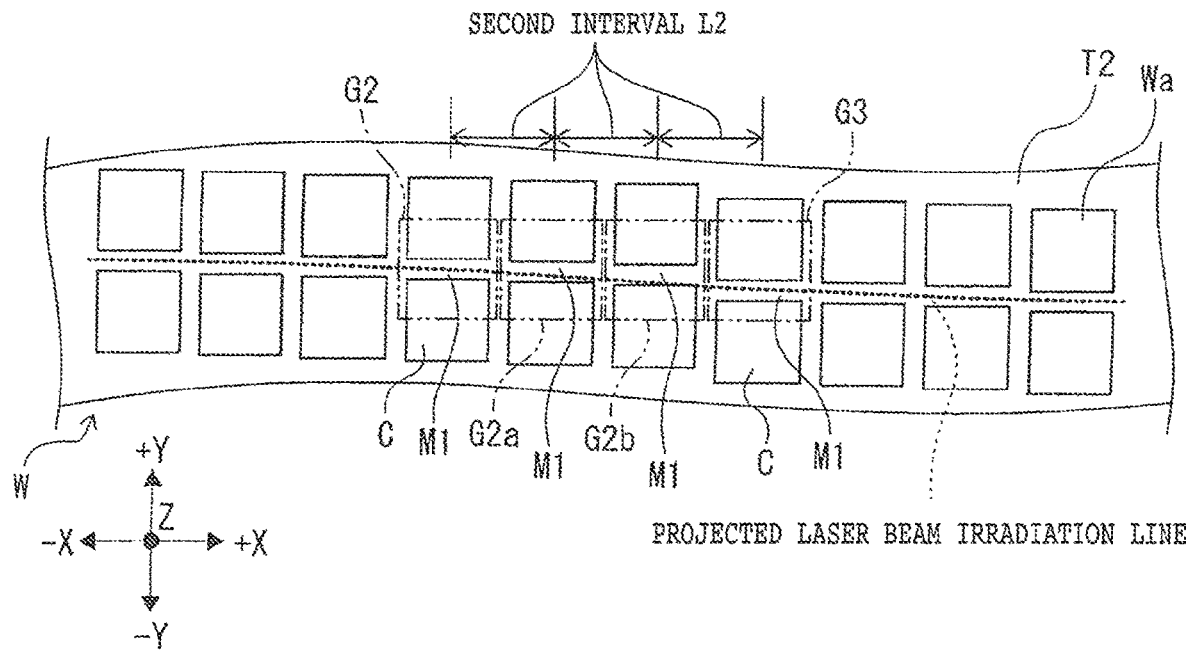
FIG. 10 is a plan view schematically depicting an image capturing area of the face side of the workpiece and a projected laser beam irradiation line in a second groove width detecting step.

As depicted in FIG. 10, while the workpiece W and the image capturing means 25 (not depicted in FIG. 10) are being moved relatively to each other in a direction along which the projected laser beam irradiation line extends, the image capturing means 25 captures images of the face side Wa at predetermined chip intervals. Specifically, the image capturing means 25 captures images of the face side Wa at second intervals L2 shorter than the first intervals L1. According to the present embodiment, each of the second intervals L2 represents a distance over one chip C, or specifically between the centers of two adjacent chips C along the X-axis directions. However, the second intervals L2 are not limited to such a distance, but may be at least a distance smaller than the first intervals L1. For example, the image capturing means 25 generates captured images of four image capturing areas: G2, G2a, G2b and G3 indicated by the two-dot-and-dash lines in FIG. 10. The image capturing areas G2, G2a, G2b and G3 cover segments of the projected laser beam irradiation line and chips C in their peripheries. Alternatively, the image capturing means 25 may capture again images of the entire projected laser beam irradiation line where the misalignment N2 in excess of the tolerance range is detected, at second intervals L2. In this case, the image capturing means 25 generates captured images of ten image capturing areas that are as many as the chips C in FIG. 10.

Figure 11:
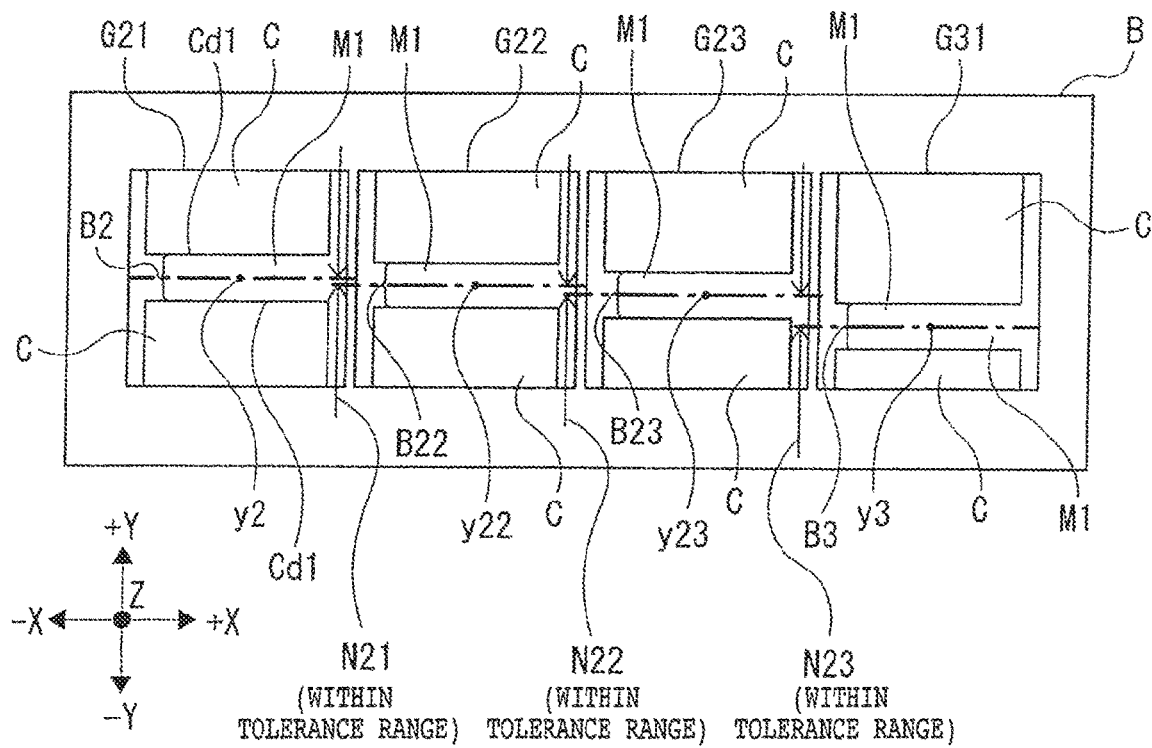
FIG. 11 is a plan view schematically depicting a captured image formed in the second groove width detecting step.

The image capturing means 25 sends data of the four captured images to the groove width detector 90 of the control means 9. The groove width detector 90 performs a filtering process on the received data of the captured images, using a sharpening filter for emphasizing the outer edges of the chips C in the captured images, and displays captured images G21, G22, G23 and G31 (see FIG. 11) generated by the groove width detector 90 after it has performed the filtering process, on a hypothetical output screen B having a predetermined resolution, as depicted in FIG. 11. The captured images G21, G22, G23 and G31 depicted in FIG. 11 correspond respectively to the image capturing areas G2, G2a, G2b and G3 depicted in FIG. 10. The captured images, the groove widths, etc. in FIG. 11 are depicted at an enlarged scale compared with those depicted in FIG. 9 for illustrative purposes.

The groove width detector 90 then calculates, from the captured images G21, G22, G23 and G31 depicted in FIG. 11, groove widths B2, B22, B23 and B3 of the groove M1 in the respective captured images and also central coordinates y2, y22, y23 and y3 of the groove widths B2, B22, B23 and B3 of the groove M1, in the same manner as in the groove width detecting step described above.

(5) Laser Beam Irradiation Line Calculating Step After the Second Groove Width Detecting Step Then, the laser beam irradiation line calculator 91 compares the central coordinate y2 of the groove width B2 in the captured image G21 and the central coordinate y22 of the groove width B22 in the captured image G22 that is positioned adjacent to the captured image G21 with each other, and calculates a misalignment N21 of the groove M1 between the captured images G21 and G22. The misalignment N21 is represented by the difference between the coordinate values of the central coordinate y2 of the groove width 32 and the central coordinate y22 of the groove width B22, i.e., the distance between the central coordinates y2 and y22 in the Y-axis directions. Likewise, the laser beam irradiation line calculator 91 calculates misalignments N22 and N23 depicted in FIG. 11.

Figures 12, 13:
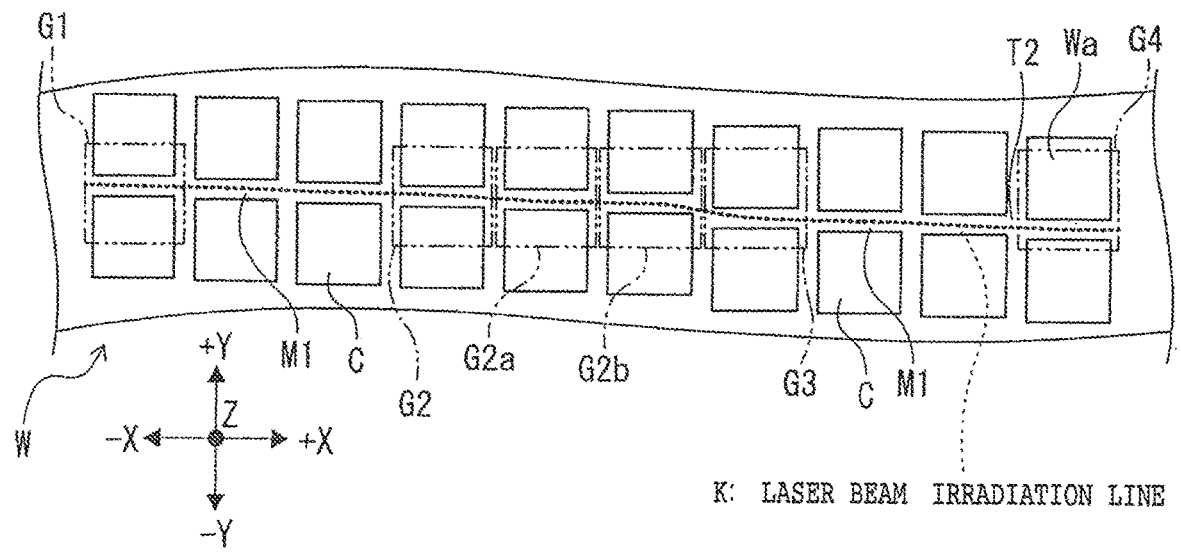
FIG. 12 is a plan view schematically depicting an image capturing area of the face side of the workpiece and a laser beam irradiation line.
FIG. 13 is a data table depicting an example of processing conditions and lengths of processing marks that correspond to respective misalignment levels.

The laser beam irradiation line calculator 91 decides whether the calculated misalignments N21 through N23 fall in the tolerance range or not. In the present embodiment, since the calculated misalignments N21 through N23 fall in the tolerance range, the laser beam irradiation line calculator 91 determines a laser beam irradiation line. Specifically, as depicted in FIG. 12, the laser beam Irradiation line calculator 91 determines a line interconnecting the central coordinates of the groove widths in the respective adjacent captured images as a laser beam irradiation line. Specifically, in the areas between the image capturing area G1 and the image capturing area G2 depicted in FIG. 12, a line interconnecting the central coordinate y1 in the captured image G11 and the central coordinate y2 in the captured image G21 depicted in FIG. 9 becomes a laser beam irradiation line. In the areas between the image capturing area G2 and the image capturing area G3 depicted in FIG. 12, a line interconnecting the central coordinates y2, y22, y23 and y3 in the captured images G21, G22, G23 and G31 depicted in FIG. 11 becomes a laser beam irradiation line. In the areas between the image capturing area G3 and the image capturing area G4 depicted in FIG. 12, a line interconnecting the central coordinate y3 in the captured image G31 and the central coordinate y4 in the captured image G41 depicted in FIG. 9 becomes a laser beam irradiation line. As a result, the laser beam irradiation line calculator 91 determines a laser beam irradiation line K that does not overlap any chips C, as depicted in FIG. 12.

If any of the misalignments N21 through N23 falls outside of the tolerance range, then the laser beam irradiation line calculator 91 may decide on an error, indicating that the workpiece W is a workpiece which does not lend itself to laser processing, for example. The groove width detector 90 may establish a third interval shorter than the second interval L2 and carry out a third groove width detecting step using the third interval.

(6) Level Determining Step

As depicted in FIG. 5, the control means 9 includes a level determiner 92 for determining a misalignment level of the laser beam irradiation line K according to the calculated misalignments of the laser beam irradiation line K in widthwise directions (Y-axis directions) of the groove M1. As depicted in FIG. 13, the level determiner 92 has a data table 92A of misalignment levels and corresponding processing conditions. The level determiner 92 determines a misalignment level according to the misalignments of the laser beam irradiation line K in widthwise directions (Y-axis directions) of the groove M1, i.e., the displacements (bends) of the laser beam irradiation line K in the Y-axis directions. The level determiner 92 determines a misalignment level for each laser beam irradiation line, for example. The misalignment levels in the data table 92A are classified into four stages including Level 1 (minute misalignment level), Level 2 (small misalignment level), Level 3 (medium misalignment level), and Level 4 (large misalignment level). However, the misalignment levels are not limited to those stages, but may be classified into more stages. Level 4 is a level representing a limit up to which a laser beam is able to follow the laser beam irradiation line by moving the workpiece W in the Y-axis directions. The misalignment level of the laser beam irradiation line K depicted in FIG. 12 according to the present embodiment is Level 3, for example.

Certain processing conditions, i.e., processing feed rates of the workpiece W and laser beam output powers, in the data table 92A depicted in FIG. 13 are represented by numerical values by way of example that were obtained when appropriate processing results were achieved from experiments in which the laser processing apparatus 2 was operated to separate adhesive films T2 stuck to a plurality of experimental workpieces. Those numerical values are inherent in the misalignment levels. The laser beam output powers (W) at the respective misalignment levels represent output power levels large enough to ablate the adhesive films T2.

The higher the misalignment level is, the lower the processing feed rate becomes in order to guarantee that a laser beam has an increased ability to follow the laser beam irradiation line by moving the workpiece W in the indexing-feed directions, i.e., the Y-axis directions. The higher the misalignment level is, the lower the laser beam output power becomes because as the processing feed rate is lower, the position where the laser beam is applied to the adhesive film T2 moves slower, and hence the energy that the adhesive film T2 absorbs from the applied laser beam becomes lower, thereby making the adhesive film T2 absorb uniform energy per laser beam irradiation line.

The lengths of processing marks in the data table 92A depicted in FIG. 13 are represented by numerical values inherent in the misalignment levels. According to the present embodiment, if the misalignment level of the laser beam irradiation line is Level 1, then the length of a processing mark on the tape T3 is 0 mm, i.e., no processing mark is formed on the tape T3. As the misalignment level of the laser beam irradiation line increases by one, the length of a processing mark on the tape T3 increases by 10 mm. The lengths of processing marks at the respective misalignment levels are not limited to the illustrated numerical values.

(7) Laser Processing Step

Then, a laser processing step is carried out to apply a laser beam to the adhesive film T2 at the bottom of the groove M1 along the laser beam irradiation line K depicted in FIG. 12, thereby separating the adhesive film T2. In the laser processing step, the workpiece W is processed by a laser beam under the processing conditions in the data table 92A depicted in FIG. 13 according to the misalignment level determined in the level determining step.

Figure 14:
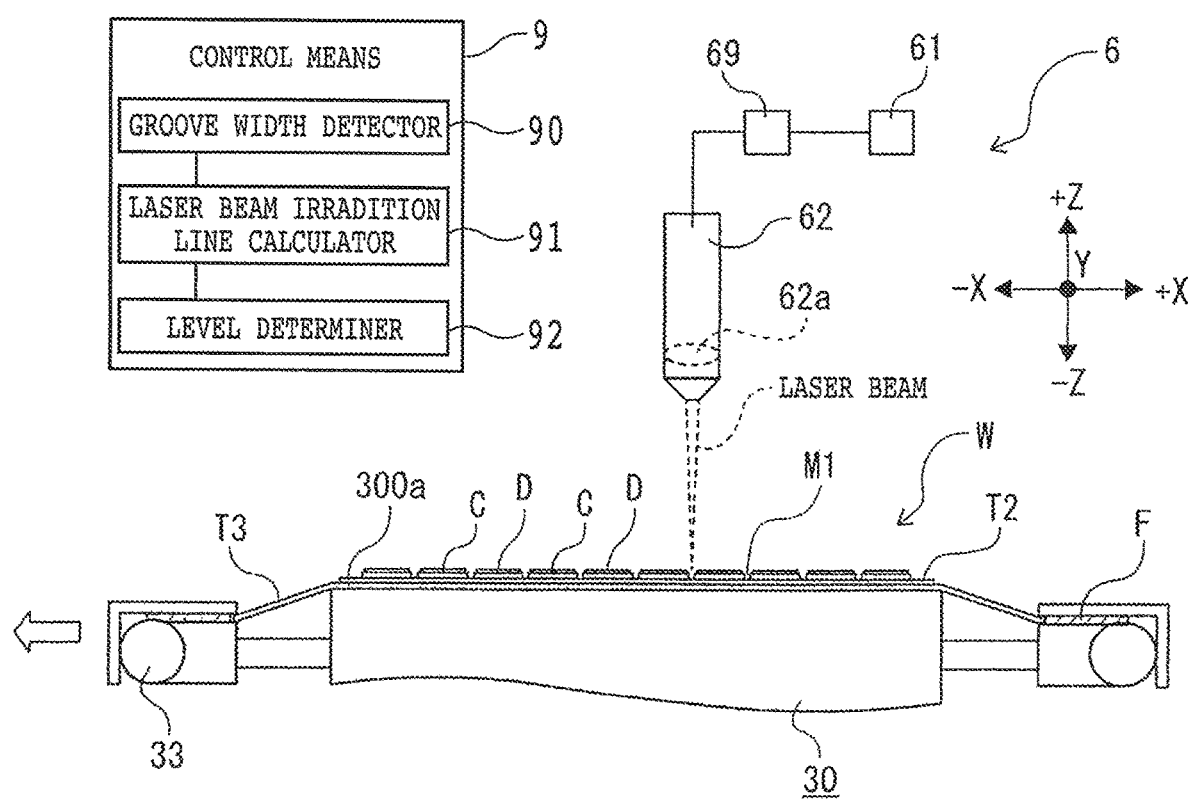
FIG. 14 is a cross-sectional view depicting the manner in which the adhesive film is separated by a laser beam applied thereto at the bottom of a groove along a laser beam irradiation line.

As depicted in FIG. 14, the holding table 30 that holds the workpiece W thereon is fed in the −X direction (forward direction), and indexing-fed in one of the Y-axis directions to position the condenser 62 of the laser beam applying means 6 so that it will pass over the laser beam irradiation line K depicted in FIG. 12. The focused spot of a laser beam focused by the condensing lens 62a is positioned at the height of the adhesive surface (upper surface) of the adhesive film T2 exposed on the bottom of the groove M1.

Since the misalignment level of the laser beam irradiation line K is Level 3, the position in the X-axis directions where a laser beam will start being applied is on the tape T3 where it is spaced 20 mm in the −X direction from an outer peripheral edge of the adhesive film T2 in the −X direction under the positional control by the control means 9 of the holding table 30 in the X-axis directions using the data table 92A depicted in FIG. 13. When the holding table 30 is processing-fed in the −X direction while a laser beam having a predetermined wavelength is being applied from the laser beam applying means 6 to the tape T3, a processing mark having a length of 20 mm corresponding to Level 3 depicted in FIG. 15 is formed on the tape T3.

As depicted in FIG. 14, when the holding table 30 is processing-fed in the −X direction, the position where a laser beam is to be applied is shifted from the tape T3 onto the adhesive film T2 along the laser beam irradiation line K. Then, the laser beam oscillator 61 emits a laser beam having a predetermined wavelength, and the laser beam is focused on and applied to the adhesive film T2 on the workpiece W that is held on the holding table 30. The laser beam is a pulsed laser beam oscillated at a predetermined repetitive frequency, and ablates the adhesive film T2 at the focused spot, thereby separating the adhesive film T2. Inasmuch as the misalignment level of the laser beam irradiation line K is Level 3, the holding table 30 is fed at a processing feed rate of 50 mm/second and the output power of the laser beam emitted from the laser beam oscillator 61 is adjusted to 0.5 W by the output power adjuster 69 under the control by the control means 9 using the data table 92A depicted in FIG. 13.

The laser beam is applied from the condenser 62 to the adhesive film T2 along the laser beam irradiation line K. Specifically, according to the present embodiment, while the holding table 30 is being fed in the −X direction at a processing feed rate of 50 mm/second, the holding table 30 is appropriately moved in one of the axis directions under the control by the control means 9. Therefore, the laser beam is applied to the adhesive film T2 at the bottom of the groove M1 while following the laser beam irradiation line K.

The workpiece W is moved in unison with the holding table 30 in the −X direction to a position in the X-axis directions where the laser beam finishes being applied to the single laser beam irradiation line K depicted in FIG. 12, whereupon the adhesive film T2 at the bottom of the groove M1 corresponding in position to the single laser beam irradiation line K is separated.

As the misalignment level of the laser beam irradiation line K is Level 3, the holding table 30 is further processing-fed in the −X direction, thereby shifting the position where a laser beam is to be applied from the adhesive film T2 onto the tape T3 under the positional control by the control means 9 of the holding table 30 in the X-axis directions using the data table 92A depicted in FIG. 13. Therefore, a laser beam is to be applied to the tape T3 along the groove M1, or stated otherwise, along the laser beam irradiation line K, beyond the outer peripheral edge of the workpiece W, forming a processing mark having a length of 20 mm corresponding to Level 3 from an outer peripheral edge of the adhesive film T2 in the +X direction onto the tape T3 in the +X direction. In FIG. 15, lines along which the adhesive film T2 is separated by the laser beam are represented by straight lines for illustrative purposes. According to the present embodiment, processing marks are formed on the sides of the tape T3 in the −X direction and the +X direction beyond the outer peripheral edges of the workpiece W, as depicted in FIG. 15.

However, processing marks may be formed on the side of the tape T3 only in the +X direction, for example.

Then, the laser beam stops being applied and the processing feed of the workpiece W in the −X direction (forward direction) is temporarily stopped. Then, the holding table 30 depicted in FIG. 14 is indexing-fed in one of the Y-axis directions, and a groove M1 positioned next to the groove M1 to which the laser beam has been applied in the forward direction and the image capturing means 25 are brought into positional alignment with each other. Thereafter, the groove width detecting step and the laser beam irradiation line calculating step are carried out in the same manner as described above, calculating a second laser beam irradiation line.

Then, the level determining step is carried out to determine a misalignment level of the calculated second laser beam irradiation line. For example, the misalignment level of the calculated second laser beam irradiation line is determined as Level 4. Then, the laser processing step is carried out to process the adhesive film T2 with a laser beam along the second laser beam irradiation line under the processing conditions corresponding to Level 4 in the data table 92A depicted in FIG. 13, i.e., at a processing feed rate of 20 mm/second and a laser beam output power of 0.05 W. The laser beam is also applied to the tape T3 along the groove M1 beyond an outer peripheral edge of the workpiece W, forming a processing mark having a length of 30 mm corresponding to Level 4 on the tape T3 as depicted in FIG. 15. The above steps are successively carried out repeatedly to apply laser beams to the adhesive film T2 at the bottoms of all the grooves M1 along laser beam irradiation lines corresponding to all the grooves M1 that extend in the X-axis directions, thereby separating the adhesive film T2.

Then, the holding table 30 is turned 90 degrees, and laser beams are applied to the adhesive film T2 at the bottoms of the grooves M1, thereby separating the adhesive film T2 at the bottoms of the grooves M1 along all the grooves M1 in a grid pattern, as depicted in FIG. 15.

The laser processing method according to the present invention includes the level determining step of determining a misalignment level of a laser beam irradiation line calculated in the laser beam irradiation line calculating step, according to the misalignment of the laser beam irradiation line in widthwise directions of a groove M1, and the laser processing step of processing the adhesive film T2 with a laser beam under processing conditions corresponding to the misalignment level determined in the level determining step. Therefore, a misalignment level is determined with respect to each single laser beam irradiation line according to a calculated misalignment thereof, and the adhesive film T2 is processed with a laser beam along the signal laser beam irradiation line under processing conditions corresponding to the determined misalignment level. Accordingly, the adhesive film T2 can be separated efficiently without causing damage to the chips C and hence devices D thereon.

In the laser processing step, the adhesive film T2 is processed with a laser beam at a processing feed rate corresponding to the misalignment level of the laser beam irradiation line that has been determined in the level determining step, so that the laser beam has a better ability to follow the laser beam irradiation line by moving the workpiece W in the indexing-feed directions, i.e., the Y-axis directions. Accordingly, the adhesive film T2 can be separated more efficiently without causing damage to the chips C and hence devices D thereon. Specifically, with respect to a laser beam irradiation line having a higher misalignment level, for example, the holding table 30 is processing-fed at a lower rate, increasing the ability of the laser beam to follow the laser beam irradiation line. Therefore, the laser beam is less likely to be displaced off the laser beam irradiation line and applied to the chips C.

In the laser processing step, a laser beam is applied to the tape T3 along the groove M1 beyond the outer peripheral edge of the workpiece W, forming a processing mark having a length corresponding to the misalignment level of the laser beam irradiation line. The processing mark makes it easy for the operator to recognize the misalignment level of the laser beam irradiation line after the laser processing step, based on the length of the processing mark on the tape T3 that can easily be visually recognized by the operator. Since the operator can easily recognize the misalignment level of the laser beam irradiation line, the operator finds it easy to select and perform an appropriate inspection depending on the misalignment level, of the laser beam irradiation line.

The laser processing method according to the present invention is not limited to the embodiment described above, and the laser processing apparatus 2 is not limited to the details illustrated in the accompanying drawings, but various changes and modifications may be made therein without departing from the scope of the invention.

The laser processing method according to the present invention should preferably be carried out by repeating the groove width detecting step, the laser beam, irradiation line calculating step, the level determining step, and the laser processing step per laser beam irradiation line along each groove M1. The reasons for such a repetition of the steps are as follows. While the laser processing step is being performed, the workpiece W and various components of the laser processing apparatus 2 are expanded due to heat and have their dimensions changed slightly. In the laser processing method according to the present invention, the above steps that are repeated per laser beam irradiation line along each groove M1 make it possible to compensate for dimensional changes on account of the thermal expansion, thereby processing the workpiece W to a nicety. In the laser processing method according to the present invention, however, the groove width detecting step, the laser beam irradiation line calculating step, and the level determining step may be carried out for all the laser beam irradiation lines along the grooves M1, after which the laser processing step may be carried out for all the laser beam irradiation lines.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method for applying a laser beam to an adhesive film applied to a reverse side of a workpiece, which has been divided into individual chips along a plurality of intersecting streets on a face side of the workpiece, with grooves formed in the workpiece between adjacent chips along the streets and the adhesive film disposed at the bottoms of the grooves, the method comprising:
    a holding step of holding an adhesive film side of the workpiece on a holding table;
    a groove width detecting step of detecting widths of the grooves between outer edges of the chips spaced in a Y-direction in the workpiece held in the holding step at predetermined chip intervals and detecting central coordinates of the widths of the grooves between the chips at said predetermined chip intervals;
    a laser beam irradiation line calculating step of calculating a laser beam irradiation line along which the laser beam is to be applied to the adhesive film, based on the widths of the grooves and the central coordinates of the grooves detected in the groove width detecting step;
    a misalignment level determining step of determining misalignment levels of the laser beam irradiation line calculated in the laser beam irradiation line calculating step by comparing misalignments of the grooves based on the central coordinates of the grooves associated with the chips at said predetermined chip intervals in widthwise directions thereof; and
    a laser processing step performed after the laser beam irradiation line calculating step and the misalignment level determining step, wherein the laser processing step includes applying the laser beam to the adhesive film at the bottoms of the grooves along the laser beam irradiation line calculated in the laser beam irradiation line calculating step, thereby separating the adhesive film along the laser beam irradiation line without contacting the chips;
    wherein the laser processing step includes applying the laser beam to the adhesive film under processing conditions corresponding to the misalignment levels determined in the misalignment level determining step.

2. The laser processing method according to claim 1, wherein the laser processing step includes a step of processing the adhesive film with the laser beam at processing feed rates corresponding to the misalignment levels determined in the misalignment level determining step.

3. The laser processing method according to claim 1,
    wherein a tape is stuck to a lower surface of the adhesive film on the reverse side of the workpiece; and
    the laser processing step includes a step of applying the laser beam to the tape along the grooves beyond an outer peripheral edge of the workpiece, thereby forming processing marks on the tape, the processing marks having lengths corresponding to the misalignment levels.

4. The laser processing method according to claim 1, further comprising changing a condition in the groove width detecting step and repeating the groove width detecting step when at least one of the misalignment levels is outside of a tolerance range.

5. The laser processing method according to claim 1, wherein the misalignment level determining step includes determining a difference between coordinate values of the central coordinates of the widths of the grooves associated with the chips in said predetermined chip intervals.

6. The laser processing method according to claim 1, wherein the misalignment level determining step includes comparing the misalignment levels to predetermined misalignment levels stored in a data table.

7. The laser processing method according to claim 6, wherein the misalignment levels in the data table are classified into the following categories: minute misalignment level, small misalignment level, medium misalignment level and large misalignment level.

8. The laser processing method according to claim 4, wherein changing the condition in the groove width detecting step includes reducing the predetermined chip intervals and detecting central coordinates of the widths of the grooves.

* * * * *